United States Patent
Yu et al.

(10) Patent No.: US 6,818,553 B1
(45) Date of Patent: Nov. 16, 2004

(54) ETCHING PROCESS FOR HIGH-K GATE DIELECTRICS

(75) Inventors: Mo-Chiun Yu, Taipei (TW); Yuan-Hung Chiu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 10/146,315

(22) Filed: May 15, 2002

(51) Int. Cl.$^7$ .............................................. H01L 21/44
(52) U.S. Cl. ...................................... 438/648; 438/785
(58) Field of Search ................................ 438/240, 287, 438/591, 648, 685, 689, 704, 745, 761, 764, 785

(56) References Cited

U.S. PATENT DOCUMENTS

| | | | |
|---|---|---|---|
| 6,069,381 A | 5/2000 | Black et al. | 257/316 |
| 6,100,173 A | 8/2000 | Gardner et al. | 438/592 |
| 6,210,999 B1 | 4/2001 | Gardner et al. | 438/183 |
| 6,271,094 B1 | 8/2001 | Boyd et al. | 438/287 |
| 6,358,810 B1 * | 3/2002 | Dornfest et al. | 438/396 |
| 6,451,647 B1 * | 9/2002 | Yang et al. | 438/240 |
| 6,617,210 B1 * | 9/2003 | Chau et al. | 438/240 |

OTHER PUBLICATIONS

Van Zant, "Microchip Fabrication", 4$^{th}$ ed., pp. 120, 271.*

* cited by examiner

*Primary Examiner*—Luan Thai
*Assistant Examiner*—Lisa Kilday
(74) *Attorney, Agent, or Firm*—Haynes and Boone, LLP

(57) ABSTRACT

A method for forming a gate electrode comprising the following steps. A substrate having a high-k gate dielectric layer formed thereover is provided. A gate layer is formed over the high-k gate dielectric layer. A gate ARC layer is formed over the gate layer. The gate ARC layer and the gate layer are patterned to form a pattern gate ARC layer and a patterned gate layer. The high-k gate dielectric layer not under the patterned gate layer is partially etched and a smooth exposed upper surface of the patterned gate layer is formed. The partially etched high-k gate dielectric layer portions not under the patterned gate layer are removed to form the gate electrode comprised of the patterned gate layer and the etched high-k gate dielectric layer.

37 Claims, 3 Drawing Sheets

SECOND EMBODIMENT

ETCHING PROCESS FOR HIGH-K GATE DIELECTRICS

FIELD OF THE INVENTION

The present invention relates generally to semiconductor fabrication and more specifically to processes of etching high-k gate dielectric layers.

BACKGROUND OF THE INVENTION

High dielectric constant (high-k) dielectrics were thought to replace silicon oxide ($SiO_2$) in the near future due to their low leakage current as compared to $SiO_2$ of the same equivalent oxide thickness (EOT). But there have been many problems in attempting to incorporate high-k dielectrics into the current complimentary metal-oxide semiconductor (CMOS) process flow such as thermal instability (the high-k material degrades under high temperature), transconductance, cross-contamination (metal out-diffusion from high-k dielectric metal oxides during thermal processes) and Gm/Idsat degradation (due to the presence of fixed charges and unstable high-k dielectric/poly-Si interface, mobility degradation of the MOS).

The high-k material has a slow etch rate compared to $SiO_2$ and further, the high-k gate dielectric reacts with the poly-Si gate to form an interfacial layer therebetween which is difficult to etch. In the high-k gate dielectric etching process, $H_3PO_4$ and HF based chemical etches are not considered because of the concerns on poly-Si gate damage and shallow trench isolation (STI) over-loss (i.e. the STI will be over-etched as compared to the high-k gate dielectric layer). The present invention focuses upon these etching issues.

U.S. Pat. No. 6,271,094 B1 to Boyd et al. describes a high-k layer and gate patterning process.

U.S. Pat. No. 6,210,999 B1 to Gardner et al. describes a high-k gate dielectric and gate etch process.

U.S. Pat. No. 6,069,381 to Black et al. and U.S. Pat. No. 6,100,173 to Gardner et al. describe other high-k gate dielectric and gate patterning processes.

SUMMARY OF THE INVENTION

Accordingly, it is an object of one or more embodiments of the present invention to provide a improved method of etching high-k gate dielectric layers.

Other objects will appear hereinafter.

It has now been discovered that the above and other objects of the present invention may be accomplished in the following manner. Specifically, a substrate having a high-k gate dielectric layer formed thereover is provided. A gate layer is formed over the high-k gate dielectric layer. A gate ARC layer is formed over the gate layer. The gate ARC layer and the gate layer are patterned to form a patterned gate ARC layer and a patterned gate layer. The high-k gate dielectric layer not under the patterned gate layer is partially etched and a smooth exposed upper surface of the patterned gate layer is formed. The partially etched high-k gate dielectric layer portions not under the patterned gate layer are removed to form the gate electrode comprised of the patterned gate layer and the etched high-k gate dielectric layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Unless otherwise specified, all structures, layers, steps, methods, etc. may be formed or accomplished by conventional steps or methods known in the prior art.

First Embodiment

Initial Structure

Figure 1:
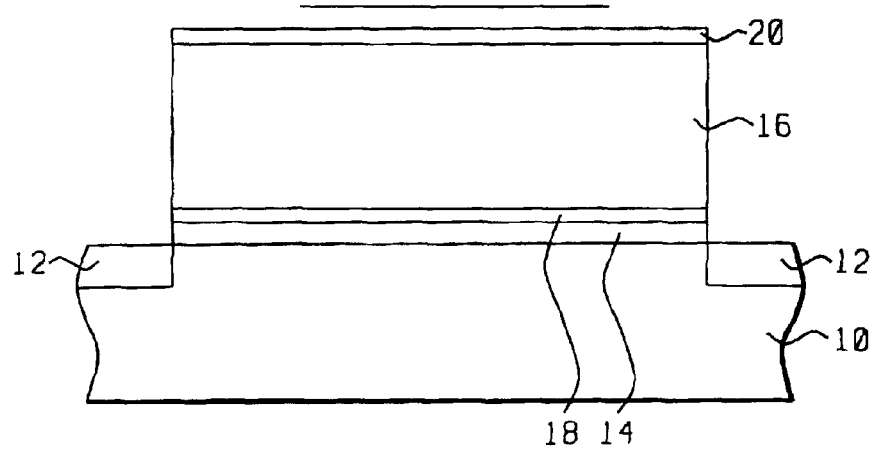
FIGS. 1 to 5 schematically illustrate a first preferred embodiment of the present invention.

As shown in FIG. 1, structure 10 may include (shallow trench isolation) structures 12. Structure 10 is preferably a silicon substrate and is understood to possibly include a semiconductor wafer or substrate. STIs 12 are preferably comprised of plasma oxide formed by an high-density plasma (HDP) process or a sub-atmospheric chemical vapor deposition (SACVD) process.

High-k gate dielectric layer 14 is formed over silicon substrate 10 to a thickness of preferably from about 20 to 100 Å and more preferably from about 30 to 50 Å. High-k gate dielectric layer 14 is preferably comprised of $ZrSiO_4$, $HfSiO_4$, $LaSiO_4$, $YSiO_4$, $ZrSi_xO_y$ or $HfSi_xO_y$ and is more preferably comprised of $ZrSi_xO_y$ or $HfSi_xO_y$.

In a key step of the first embodiment, gate layer 16 is formed over high-k gate dielectric layer 14 to a thickness of preferably from about 400 to 3000 Å and more preferably from about 1200 to 1800 Å which is slightly thicker than in conventional processes so as to compensate for the subsequent etch loss from the Ar sputter or the F-based-chemistry plasma etch 24 as described below.

Gate layer 16 is preferably comprised of polysilicon (poly-Si), polycide or a poly-Si/poly-Ge stack structure and is more preferably comprised of poly-Si.

High-k gate dielectric layer 14 reacts with the poly-Si gate layer 16 to form interfacial layer 18 which is very hard to etch. Interfacial layer 18 is preferably from about 3 to 10 Å thick and is more preferably from about 3 to 5 Å thick.

Gate anti-reflective coating (ARC) 20 is formed over poly-Si gate layer 16 to a thickness of preferably from about 100 to 500 Å and more preferably from about 200 to 400 Å. Gate ARC 20 is preferably comprised of SiN, SiON, silicon oxide, organic ARC or an organic ARC/SiON stack structure and is more preferably comprised of an organic ARC/SiON stack structure.

Gate Patterning

Figure 2:
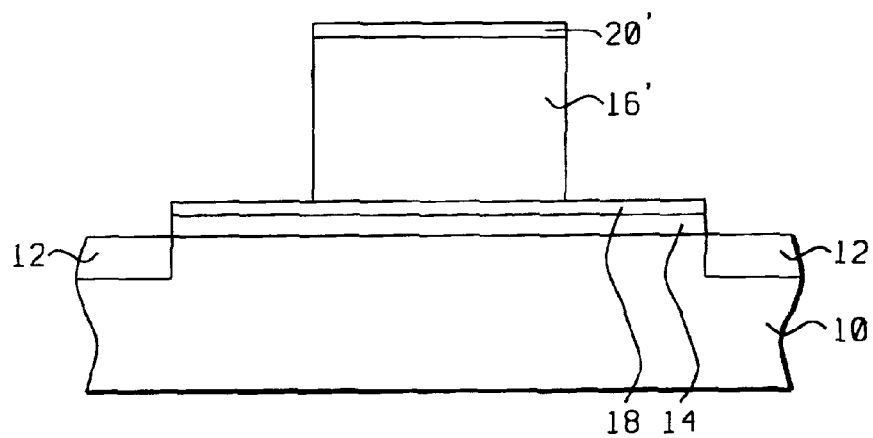

As shown in FIG. 2, gate ARC 20 and poly-Si gate layer 16 are patterned to form patterned gate ARC 20' and patterned poly-Si gate 16'. ARC 20 and poly-Si gate 16 may be patterned using, for example, an overlying patterned photoresist layer (not shown).

Removal of Patterned Gate ARC 20

Figure 3:
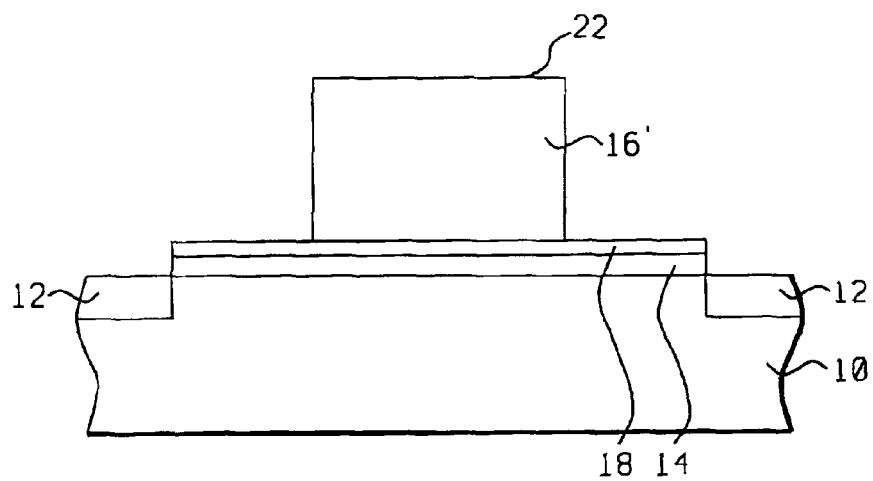

As shown in FIG. 3, patterned gate ARC 20' is stripped from patterned poly-Si gate layer 16'. This leaves the upper surface 22 of patterned poly-Si gate layer 16' rough.

Figure 4:
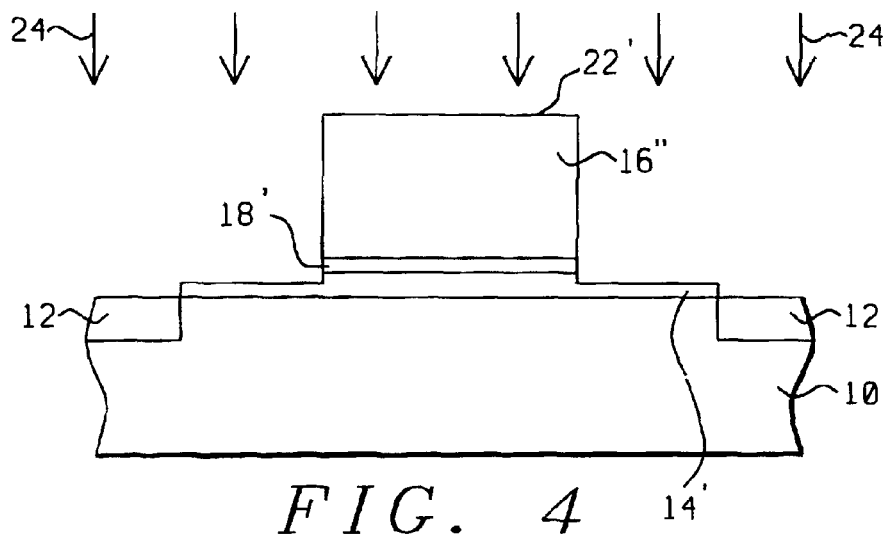

Argon (Ar) Sputter or Fluorine (F)-Based-Chemistry Plasma Etch 24—Another Key Step of the Invention In another key step of the invention, and as shown in FIG. 4, the structure of FIG. 3 is subjected to an argon (Ar) sputter or a fluorine (F)-based-chemistry plasma etch 24 which thins patterned gate layer 16' to form thinner patterned gate layer 16" having a smooth upper surface 22'. Ar sputter/F-basedchemistry plasma etch 24 also removes: (1) the exposed portions of interfacial layer 18 not under patterned gate layer 16' to form patterned interfacial layer 18'; and (2) a portion of the exposed portions of high-k gate dielectric layer 14 not under patterned gate layer 16' to form partially etched high-k gate dielectric layer 14'.

Thinner patterned gate layer 16" has a thickness of preferably from about 300 to 2000 Å and more preferably from about 1000 to 1500 Å.

The F-based-chemistry of the F-based-chemistry plasma etch 24 is preferably: (1) $C_xF_y$ such as $CF_4$, $C_2F_6$, $C_4F_6$ or $C_4F_8$; (2) $C_xH_yF_z$ such as $CHF_3$, $CH_2F_2$ or $CH_3F$; or $S_xF_y$ such as $SF_6$; and is more preferably: $CF_4$, $C4F_6$, $CH_2F_2$ or $CH_3F$. The F-based-chemistry may also include an inert gas such as helium (He) or Ar, for example: $CF_4/Ar/O_2$ or $CF_4/Ar$ and is more preferably $CF_4/Ar/O_2$.

The smooth upper surface 22' of patterned gate layer 16' is better for any subsequent silicide process to form a silicide portion over patterned gate layer 16'.

If an Ar sputter 24 is selected, it is conducted at the following parameters:

Ar: preferably from about 20 to 500 sccm; and more preferably from about 100 to 200 sccm;

power: preferably from about 200 to 2000 Watts; and more preferably from about 300 to 500 Watts;

temperature: preferably from about 0 to 100° C.; and more preferably from about 80 to 90° C.;

pressure: preferably from about 5 to 50 mTorr; and more preferably from about 20 to 50 mTorr; and time: preferably from about 5 to 30 seconds; and more preferably from about 5 to 10 seconds.

If an F-based-chemistry plasma etch 24 is selected, it is conducted at the following parameters:

CF4: preferably from about 1 to 100 sccm; and more preferably from about 5 to 30 sccm;

Ar: preferably from about 10 to 1000 sccm; and more preferably from about 50 to 300 sccm;

top power: preferably from about 100 to 1000 Watts; and more preferably from about 300 to 700 Watts;

bottom power: preferably from about 0 to 500 Watts; and more preferably from about 50 to 200 Watts; and pressure: preferably from about 1 to 200 mTorr; and more preferably from about 2 to 50 mTorr.

Wet Etch 26 to Remove Remaining Exposed Portions of High-K Gate Dielectric Layer 14'

Figure 5:
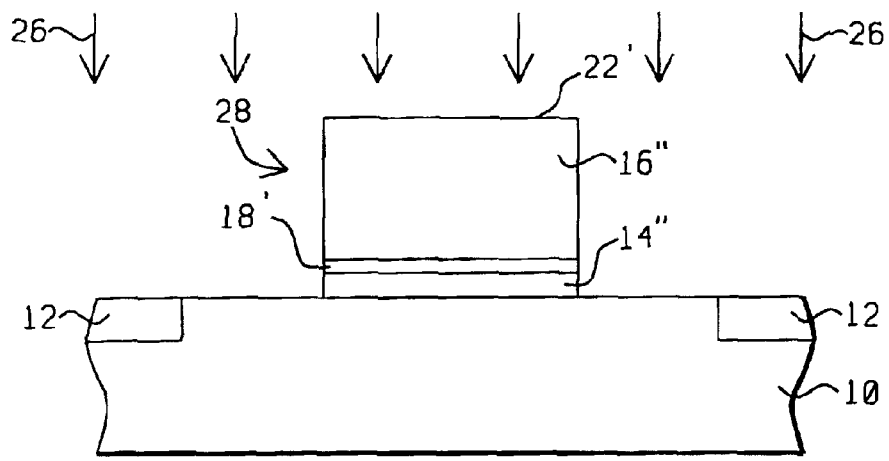

As shown in FIG. 5, a wet etch 26 is used to remove the remaining exposed portions of partially etched high-k gate dielectric layer 14' from over silicon substrate 10 not under patterned gate layer 16' to form etched high-k gate dielectric layer 14". Patterned gate layer 16', patterned interfacial layer 18' and etched high-k gate dielectric layer 14" comprise gate electrode 28.

Wet etch 26 is preferably a sulfuric acid ($H_2SO_4$) wet etch conducted at the following parameters:

$H_2SO_4$: preferably from about 2 to 20% by volume; and more preferably from about 2 to 5% by volume;

temperature: preferably from about 25 to 130° C. and more preferably from about 25 to 50° C.; and time: preferably from about 10 to 30 seconds and more preferably from about 10 to 20 seconds.

Further processing may then continue such as, for example, silicide formation, LDD implants, gate sidewall spacer formation, HDD implants, etc.

By using an $H_2SO_4$ wet etch 26 instead of an $H_3PO_4$ wet etch chemistry, the poly-Si sidewalls the source/drain (S/D) areas of the silicon substrate adjacent the patterned gate layer 16"/high-k gate dielectric layer 14". Also less STI 12 over-loss will be achieved than if an HF wet etch chemistry were used.

An acceptable etching rate is achieved by using the two step etch process of the first embodiment of the present invention, i.e. (1) Ar sputter 24 followed by (2) an $H_2SO_4$ wet etch 26. Another key point of the present invention is that neither the Ar sputter 24 nor the $H_2SO_4$ wet etch 26 require masking due the selectivity of each.

Second Embodiment

Initial Structure

Figure 6:
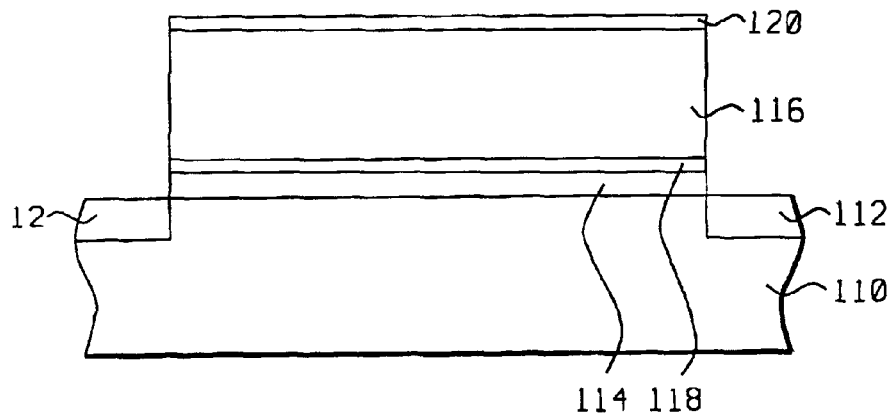
FIGS. 6 to 9 schematically illustrate a second preferred embodiment of the present invention.

As shown in FIG. 6, structure 110 may include (shallow trench isolation) structures 112. Structure 110 is preferably a silicon substrate and is understood to possibly include a semiconductor wafer or substrate. STIs 112 are preferably comprised of HDP oxide or SACVD oxide.

High-k gate dielectric layer 114 is formed over silicon substrate 110 to a thickness of preferably from about 10 to 50 Å and more preferably $ZrSiO_4$, $HfSiO_4$, $LaSiO_4$, $YSiO_4$, $ZrSi_xO_y$ from about 20 to 50 Å. High-k gate dielectric layer 114 is preferably comprised of or $HfSi_xO_y$ and is more preferably comprised of $ZrSi_xO_y$ or $HfSi_xO_y$.

Gate layer 116 is formed over high-k gate dielectric layer 114 to a thickness of preferably from about 400 to 3000 Å and more preferably from about 1200 to 1800 Å which is comparable to the thickness in conventional processes.

Gate layer 116 is preferably comprised of polysilicon (poly-Si), polycide or a poly-Si/poly-Ge stack structure and is more preferably comprised of poly-Si.

High-k gate dielectric layer 114 reacts with the poly-Si gate layer 116 to form interfacial layer 118 which is very hard to etch. Interfacial layer 118 is preferably from about 3 to 10 Å thick and is more preferably from about 3 to 5 Å thick.

Gate anti-reflective coating (ARC) 120 is formed over poly-Si gate layer 116 to a thickness of preferably from about 100 to 500 Å and more preferably from about 200 to 400 Å. Gate ARC 120 is preferably comprised of SiN, SiON, silicon oxide, organic ARC or an organic ARC/SiON stack structure and is more preferably comprised of an organic ARC/SiON stack structure.

Gate Patterning

Figure 7:
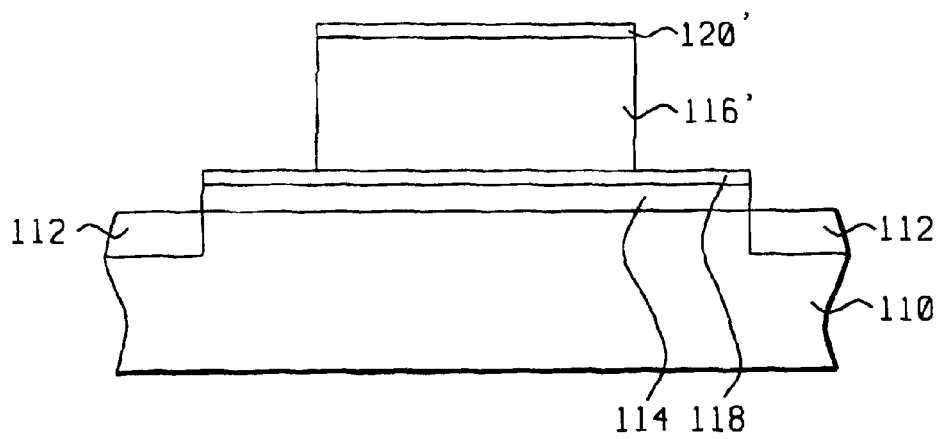

As shown in FIG. 7, gate ARC 120 and poly-Si gate layer 116 are patterned to form patterned gate ARC 120' and patterned poly-Si gate 116'. ARC 120 and poly-Si gate 116 may be patterned using, for example, an overlying patterned photoresist layer (not shown).

Argon (Ar) Sputter or Plasma Etch With a Fluorine (F)-Based-Chemistry 124—One Key Step of the Invention It is noted that the patterned gate ARC 120' is not removed from over patterned poly-Si gate layer 116' before the Ar sputter/F-based-chemistry plasma etch 124.

Figure 8:
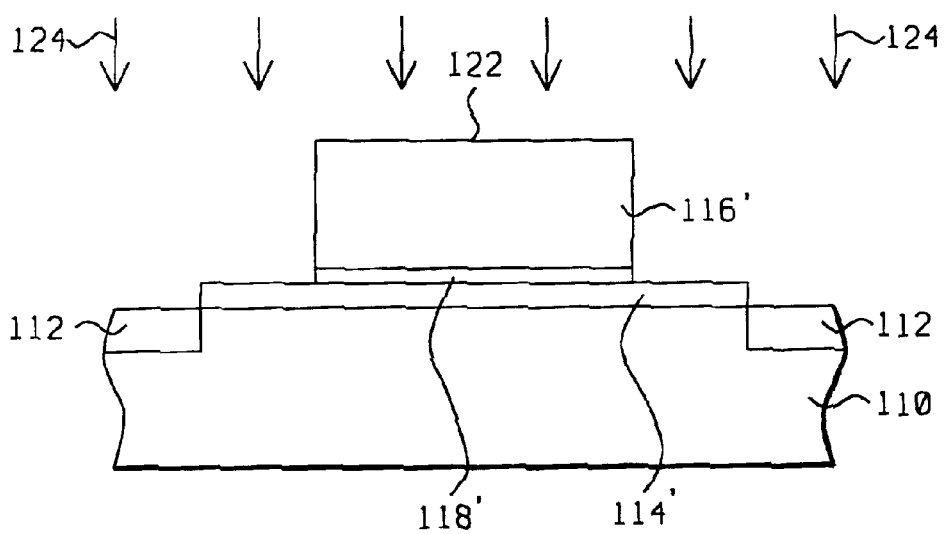

In one key step of the invention, and as shown in FIG. 8, the structure of FIG. 7 is subjected to an argon (Ar) sputter/F-based-chemistry plasma etch 124 which removes gate ARC 120 from over patterned poly-Si gate layer 116', leaving the upper surface 122 of exposed patterned poly-Si gate layer 116' smooth. Gate ARC 120 minimizes poly-Si loss from the patterned poly-Si gate layer 116'. Ar sputter/F-based-chemistry plasma etch 124 also removes: (1) the exposed portions of interfacial layer 118 not under patterned gate layer 116' to form patterned interfacial layer 118'; and (2) a portion of the exposed portions of high-k gate dielectric layer 114 not under patterned gate layer 116' to form partially etched high-k gate dielectric layer 114'.

The F-based-chemistry of the F-based-chemistry plasma etch 124 is preferably: (1) $C_xF_y$ such as $CF_4$, $C_2F_6$, $C_4F_6$ or $C_4F_8$; (2) $C_xH_yF_z$ such as $CHF_3$, $CH_2F_2$ or $CH_3F$; or $S_xF_y$ such as $SF_6$; and is more preferably: $CF_4$, $C4F_6$, $CH_2F_2$ or $CH_3F$. The F-based-chemistry may also include an inert gas such as helium (He) or Ar, for example: $CF_4/Ar/O_2$ or $CF_4/Ar$ and is more preferably $CF_4/Ar/O_2$.

The smooth upper surface 122' of patterned gate layer 16' is better for any subsequent silicide process to form a silicide portion over patterned gate layer 116'.

If an Ar sputter 124 is selected, it is conducted at the following parameters:

Ar: preferably from about 20 to 500 sccm; and more preferably from about 100 to 200 sccm;

power: preferably from about 200 to 2000 Watts; and more preferably from about 300 to 500 Watts;

temperature: preferably from about 0 to 100° C.; and more preferably from about 80 to 90° C.;

pressure: preferably from about 5 to 50 mTorr; and more preferably from about 20 to 50 mTorr; and time: preferably from about 5 to 30 seconds; and more preferably from about 5 to 10 seconds.

If an F-based-chemistry plasma etch 124 is selected, it is conducted at the following parameters:

CF4: preferably from about 1 to 100 sccm; and more preferably from about 5 to 30 sccm;

Ar: preferably from about 10 to 1000 sccm; and more preferably from about 50 to 300 sccm;

top power: preferably from about 100 to 1000 Watts; and more preferably from about 300 to 700 Watts;

bottom power: preferably from about 0 to 500 Watts; and more preferably from about 50 to 200 Watts; and pressure: preferably from about 1 to 200 mTorr; and more preferably from about 2 to 50 mTorr.

Wet Etch 126 to Remove Remaining Exposed Portions of High-K Gate Dielectric Layer 114'

Figure 9:
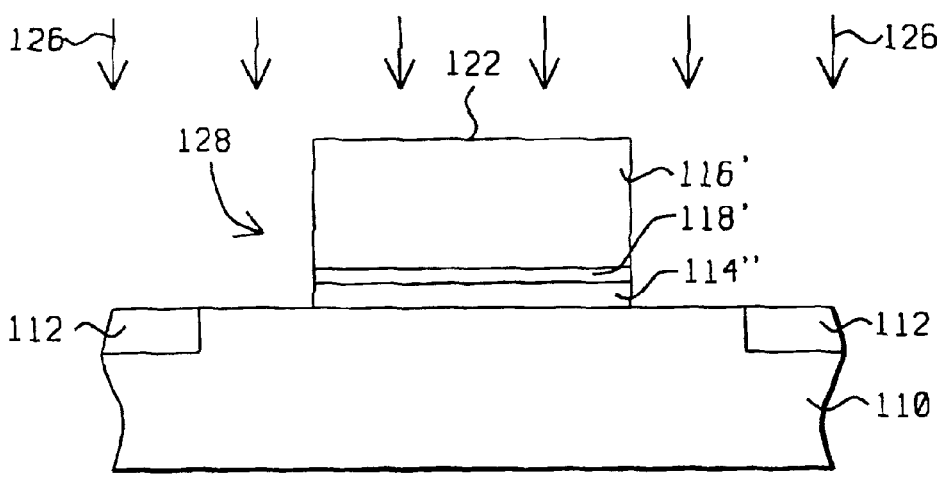

As shown in FIG. 9, a wet etch 126 is used to remove the remaining exposed portions of partially etched high-k gate dielectric layer 114' from over silicon substrate 110 not under patterned gate layer 116' to form etched high-k gate dielectric layer 114". Patterned gate layer 116', patterned interfacial layer 118' and etched high-k gate dielectric layer 114" comprise gate electrode 128.

Wet etch 126 is preferably a sulfuric acid ($H_2SO_4$) wet etch conducted at the following parameters:

$H_2SO_4$: preferably from about 2 to 20% by volume; and more preferably from about 2 to 5% by volume;

temperature: preferably from about 25 to 130° C. and more preferably from about 25 to 50° C.; and time: preferably from about 10 to 30 seconds and more preferably from about 10 to 20 seconds.

Further processing may then continue such as, for example, silicide formation, LDD implants, gate sidewall spacer formation, HDD implants, etc.

By using an $H_2SO_4$ wet etch 126 instead of an $H_3PO_4$ wet etch chemistry, the poly-Si sidewalls the source/drain (S/D) areas of the silicon substrate adjacent the patterned gate layer 116'/high-k gate dielectric layer 114". Also less STI 112 over-loss will be achieved than if an HF wet etch chemistry were used. Further, poly-Si gate layer 116 is deposited to a thickness substantially equal to those thicknesses used in conventional processes.

Advantages of the Present Invention

The advantages of one or more embodiments of the present invention include:

1. a smooth upper surface of the patterned poly-Si gate layer is achieved which provides for better subsequent silicide process formation;

2. the sidewalls of the patterned poly-Si gate layer are not deleteriously affected by the wet etch process;

3. the S/D areas of the silicon substrate are not deleteriously affected by the wet etch process;

4. less STI over-loss is achieved;

5. acceptable etching rates are achieved by using the two step etching process, i.e. the Ar sputter and the $H_2SO_4$ wet etch; and 6. in the second embodiment, the poly-Si gate layer is deposited to a thickness substantially equal to those thicknesses used in conventional processes.

While particular embodiments of the present invention have been illustrated and described, it is not intended to limit the invention, except as defined by the following claims.

We claim:

1. A method of forming a gate electrode, comprising the steps of:

providing a substrate having a high-k gate dielectric layer formed thereover;

forming a gate layer over the high-k gate dielectric layer;

forming a gate ARC layer over the gate layer;

patterning the gate ARC layer and the gate layer to form a patterned gate ARC layer and a patterned gate layer;

partially etching the high-k gate dielectric layer not under the patterned gate layer and forming a smooth exposed upper surface of the patterned gate layer; and then removing the partially etched high-k gate dielectric layer portions not under the patterned gate layer to form the gate electrode comprised of the patterned gate layer and the etched high-k gate dielectric layer.

2. The method of claim 1, wherein the substrate is a silicon substrate; the high-k gate dielectric layer is comprised of a material selected from the group consisting of $ZrSiO_4$, $HfSiO_4$, $LaSiO_4$, $YSiO_4$, $ZrSi_xO_y$ and $HfSi_xO_y$; the gate layer is comprised of a material selected from the group consisting of polysilicon, polycide and a poly-Si/poly-Ge stack structure; and the gate ARC layer is comprised of a material selected from the group consisting of SiN, SiON, silicon oxide, organic ARC and an organic ARC/SiON stack structure.

3. The method of claim 1, wherein the substrate is a silicon substrate; the high-k gate dielectric layer is comprised of a material selected from the group consisting of $ZrSi_xO_y$ and $HfSi_xO_y$; the gate layer is comprised of polysilicon; and the gate ARC layer is comprised of an organic ARC/SiON stack structure.

4. The method of claim 1, wherein the high-k gate dielectric layer not under the patterned gate layer is etched using an Ar sputter conducted at the following parameters:

Ar: from about 20 to 500 sccm;

power: from about 200 to 2000 Watts;

temperature: from about 0 to 100° C.;

pressure: from about 5 to 50 mTorr; and time: from about 5 to 30 seconds.

5. The method of claim 1, wherein the high-k gate dielectric layer not under the patterned gate layer is etched using an Ar sputter conducted at the following parameters:

Ar: from about 100 to 200 sccm;

power: from about 300 to 500 Watts;

temperature: from about 80 to 90° C.;

pressure: from about 20 to 50 mTorr; and time: from about 5 to 10 seconds.

6. The method of claim 1, wherein the partially etched high-k gate dielectric layer portions not under the patterned gate layer is etched using an $H_2SO_4$ wet etch chemistry process conducted at the following parameters:

$H_2SO_4$: from about 2 to 20% by volume;
temperature: from about 25 to 130° C.; and
time: from about 10 to 30 seconds.

7. The method of claim 1, wherein the partially etched high-k gate dielectric layer portions not under the patterned gate layer is etched using an $H_2SO_4$ wet etch chemistry process conducted at the following parameters:

$H_2SO_4$: from about 2 to 5% by volume;
temperature: from about 25 to 50° C.; and
time: from about 10 to 20 seconds.

8. The method of claim 1, wherein the high-k gate dielectric layer interacts with the gate layer to form an interfacial layer therebetween.

9. The method of claim 1, wherein the high-k gate dielectric layer interacts with the gate layer to form an interfacial layer therebetween; and wherein the Ar sputter or the F-based-chemistry plasma etch also etches and removes the interfacial layer not under the patterned gate layer.

10. The method of claim 1, wherein the substrate further includes STIs formed therein adjacent to the high-k gate dielectric layer.

11. The method of claim 1, wherein the substrate further includes STIs formed therein adjacent to the high-k gate dielectric layer; and wherein the STIs are not substantially affected by the partial etching of the high-k gate dielectric layer not under the patterned gate layer.

12. The method of claim 1, wherein high-k gate dielectric layer has a thickness of from about 20 to 100 Å; and the gate ARC layer has a thickness of from about 100 to 500 Å.

13. The method of claim 1, wherein high-k gate dielectric layer has a thickness of from about 30 to 50 Å; and the gate ARC layer has a thickness of from about 200 to 400 Å.

14. The method of claim 1, wherein high-k gate dielectric layer has a thickness of from about 10 to 50 Å; and the gate ARC layer has a thickness of from about 100 to 500 Å.

15. The method of claim 1, wherein high-k gate dielectric layer has a thickness of from about 20 to 50 Å; and the gate ARC layer has a thickness of from about 200 to 400 Å.

16. The method of claim 1, wherein the gate layer is formed to a thickness of from about 400 to 3000 Å thick and is partially etched by the Ar sputter or the F-based-chemistry plasma etch to form a partially etched gate layer having a thickness of from about 300 to 2000 Å.

17. The method of claim 1, wherein the gate layer is formed to a thickness from about 1200 to 1800 Å thick and is partially etched by the Ar sputter or the F-based-chemistry plasma etch to form a partially etched gate layer having a thickness of from about 1000 to 1500 Å.

18. The method of claim 1, wherein the patterned gate ARC layer is removed from over the patterned gate layer before the Ar sputter or the F-based-chemistry plasma etch.

19. The method of claim 1, wherein the patterned gate ARC layer is removed from over the patterned gate layer before the Ar sputter or the F-based-chemistry plasma etch and leaving a rough exposed upper surface of the patterned gate layer.

20. A method of forming a gate electrode, comprising the steps of:

providing a substrate having a high-k gate dielectric layer formed thereover;
forming a gate layer over the high-k gate dielectric layer;
forming a gate ARC layer over the gate layer;
patterning the gate ARC layer and the gate layer to form a patterned gate ARC layer and a patterned gate layer;
removing the patterned ARC layer from over the patterned gate layer;
subjecting the structure to an Ar sputter or an F-based-chemistry plasma etch to partially etch the high-k gate dielectric layer not under the patterned gate layer and to form a smooth exposed upper surface of the patterned gate layer; and
then removing the partially etched high-k gate dielectric layer portions not under the patterned gate layer using an $H_2SO_4$ wet etch chemistry process to form the gate electrode comprised of the patterned gate layer and the etched high-k gate dielectric layer.

21. The method of claim 20, wherein the substrate is a silicon substrate; the high-k gate dielectric layer is comprised of a material selected from the group consisting of $ZrSiO_4$, $HfSiO_4$, $LaSiO_4$, $YSiO_4$, $ZrSi_xO_y$ and $HfSi_xO_y$; the gate layer is comprised of a material selected from the group consisting of polysilicon, polycide and a poly-Si/poly-Ge stack structure; and the gate ARC layer is comprised of a material selected from the group consisting of SiN, SiON, silicon oxide, organic ARC and an organic ARC/SiON stack structure.

22. The method of claim 20, wherein the substrate is a silicon substrate; the high-k gate dielectric layer is comprised of a material selected from the group consisting of $ZrSi_xO_y$ and $HfSi_xO_y$; the gate layer is comprised of polysilicon; and the gate ARC layer is comprised of an organic ARC/SiON stack structure.

23. The method of claim 20, wherein the partially etched the high-k gate dielectric layer not under the patterned gate layer is etched using an Ar sputter conducted at the following parameters:

Ar: from about 20 to 500 sccm;
power: from about 200 to 2000 Watts;
temperature: from about 0 to 100° C.;
pressure: from about 5 to 50 mTorr; and
time: from about 5 to 30 seconds.

24. The method of claim 20, wherein the partially etched the high-k gate dielectric layer not under the patterned gate layer is etched using an Ar sputter conducted at the following parameters:

Ar: from about 100 to 200 sccm;
power: from about 300 to 500 Watts;
temperature: from about 80 to 90° C.;
pressure: from about 20 to 50 mTorr; and
time: from about 5 to 10 seconds.

25. The method of claim 20, wherein the $H_2SO_4$ wet etch chemistry process is conducted at the following parameters:

$H_2SO_4$: from about 2 to 20% by volume;
temperature: from about 25 to 130° C.; and
time: from about 10 to 30 seconds.

26. The method of claim 20, wherein the $H_2SO_4$ wet etch chemistry process is conducted at the following parameters:

$H_2SO_4$: from about 2 to 5% by volume;
temperature: from about 25 to 50° C.; and
time: from about 10 to 20 seconds.

27. The method of claim 20, wherein the high-k gate dielectric layer interacts with the gate layer to form an interfacial layer therebetween.

28. The method of claim 20, wherein the high-k gate dielectric layer interacts with the gate layer to form an interfacial layer therebetween; and wherein the Ar sputter or the F-based-chemistry plasma etch also etches and removes the interfacial layer not under the patterned gate layer.

29. The method of claim 20, wherein the substrate further includes STIs formed therein adjacent to the high-k gate dielectric layer.

30. The method of claim 20, wherein the substrate further includes STIs formed therein adjacent to the high-k gate dielectric layer; and wherein the STIs are not substantially affected by the $H_2SO_4$ wet etch chemistry process.

31. The method of claim 20, wherein high-k gate dielectric layer has a thickness of from about 20 to 100 Å; and the gate ARC layer has a thickness of from about 100 to 500 Å.

32. The method of claim 20, wherein high-k gate dielectric layer has a thickness of from about 30 to 50 Å; and the gate ARC layer has a thickness of from about 200 to 400 Å.

33. The method of claim 20, wherein the gate layer is partially etched by the Ar sputter or the F-based-chemistry plasma etch to form a partially etched gate layer having a thickness of from about 300 to 2000 Å.

34. The method of claim 20, wherein the gate layer is partially etched by the Ar sputter or the F-based-chemistry plasma etch to form a partially etched gate layer having a thickness of from about 1000 to 1500 Å.

35. The method of claim 20, wherein the removal of the patterned gate ARC layer from over the patterned gate layer leaves a rough exposed upper surface of the patterned gate layer.

36. The method of claim 20, wherein high-k gate dielectric layer has a thickness of from about 10 to 50 Å; and the gate ARC layer has a thickness of from about 100 to 500 Å.

37. The method of claim 20, wherein high-k gate dielectric layer has a thickness of from about 20 to 50 Å; and the gate ARC layer has a thickness of from about 200 to 400 Å.

* * * * *